US012360190B2

(12) United States Patent
Zhang et al.

(10) Patent No.: US 12,360,190 B2
(45) Date of Patent: Jul. 15, 2025

(54) REALTIME DESIGN OF RADIO-FREQUENCY PULSES AND GRADIENT PULSES IN MAGNETIC RESONANCE IMAGING

(71) Applicant: KONINKLIJKE PHILIPS N.V., Eindhoven (NL)

(72) Inventors: Yajing Zhang, Suzhou (CN); Jiazheng Wang, Beijing (CN)

(73) Assignee: Koninklijke Philips N.V., Eindhoven (NL)

(*) Notice: Subject to any disclaimer, the term of this patent is extended or adjusted under 35 U.S.C. 154(b) by 60 days.

(21) Appl. No.: 18/035,141

(22) PCT Filed: Nov. 4, 2021

(86) PCT No.: PCT/EP2021/080567
§ 371 (c)(1),
(2) Date: May 3, 2023

(87) PCT Pub. No.: WO2022/096539
PCT Pub. Date: May 12, 2022

(65) Prior Publication Data
US 2023/0408612 A1 Dec. 21, 2023

(30) Foreign Application Priority Data

Nov. 4, 2020 (WO) ................ PCT/CN2020/126499
Dec. 15, 2020 (EP) ..................................... 20214200

(51) Int. Cl.
*G01V 3/00* (2006.01)
*G01R 33/483* (2006.01)
(Continued)

(52) U.S. Cl.
CPC ....... *G01R 33/4836* (2013.01); *G01R 33/543* (2013.01); *G01R 33/5608* (2013.01)

(58) Field of Classification Search
CPC .. G01R 33/485; G01R 33/4828; G06T 11/008
(Continued)

(56) References Cited

U.S. PATENT DOCUMENTS

2017/0296072 A1 10/2017 Priatna

FOREIGN PATENT DOCUMENTS

CN 106372571 A * 2/2017 ......... G06K 9/00818

OTHER PUBLICATIONS

Luo et al "Joint Design of RF and Gradient Waveforms via Auto-Differentiation for 3d Tailored Excitation in MRI" Aug. 24, 2020 arxiv.org.
(Continued)

*Primary Examiner* — Walter L Lindsay, Jr.
*Assistant Examiner* — Frederick Wenderoth (57) ABSTRACT

Disclosed herein is a medical system (100, 300) comprising a memory (110) storing machine executable instructions (120) and a convolutional neural network (122). The convolutional neural network is configured to receive as input a complex array (128) encoding a selection of at least one excitation field of view (324, 900) and in response output a radio frequency wave form (130) and multiple spatially selective gradient pulse waveforms (132). The convolutional neural network is a multi-task convolutional neural network. The execution of the machine executable instructions causes a computational system (104) to: receive (200) a selection (124) of the at least one excitation field of view; receive (202) initial pulse sequence commands (126); encode (204) the complex array using the at least one excitation field of view; receive (206) the radio frequency wave form and the multiple spatially selective gradient pulse waveforms in response to inputting the complex array into the convolutional neural network; and construct (208) modified pulse sequence commands (134) by modifying the initial pulse
(Continued)

sequence commands with the radio frequency wave form and the multiple spatially selective gradient pulse waveforms.

15 Claims, 8 Drawing Sheets

(51) Int. Cl.
 *G01R 33/54* (2006.01)
 *G01R 33/56* (2006.01)
(58) Field of Classification Search
 USPC .......................................................... 324/309
 See application file for complete search history.

(56) References Cited

OTHER PUBLICATIONS

Mads Sloth Vinding et al "DeepControl 2D RF Pulses Facilitation B1+ inhomogeneity and B0 Off-resoance Compensation in Vivo at 7T" arxiv.org, Sep. 25, 2020.
Zhang et al "Multi-Task Convoluational Neural Network-based Design of Radio Frequency Pulse and the Accompanying Gradients for Magnetic Resonance Imaging" NMR in Biomedicine, vol. 34, No. 2 Nov. 16, 2020.
Vinding et al "Ultrafast (milliseconds) Multidimensional RF Pulse Design with Deep Learning" Magn. Reson. Med. 2019 vol. 82, p. 586-599.
International Search Report and Written Opinion from PCT/EP2021/080567 mailed Jan. 21, 2022.

\* cited by examiner

REALTIME DESIGN OF RADIO-FREQUENCY PULSES AND GRADIENT PULSES IN MAGNETIC RESONANCE IMAGING

CROSS REFERENCE TO RELATED APPLICATIONS

This application is a U.S. national phase application of International Application No. PCT/EP2021/080567 filed on Nov. 4, 2021, which claims the benefit of EP application Ser. No. 20/214200.6 filed on Dec. 15, 2020 and CN Application Serial No. PCT/CN2020/126499 filed on Nov. 4, 2020, both of which are incorporated herein by reference.

FIELD OF THE INVENTION

The invention relates to magnetic resonance imaging, in particular to the design of pulse sequences for controlling magnetic resonance imaging systems.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI. Spatial encoding in magnetic resonance imaging is performed using a combination of a radio frequency (RF) waveform (or RF pulse) that is used to control the transmit coil of the MRI scanner and multiple spatially selective gradient pulse waveforms (gradient pulses).

The journal publication Vinding et. al, "*Ultrafast (milliseconds), multidimensional RF pulse design with deep learning,*" Magn. Reson. Med. 2019; 82:586-599 discloses the use of a neural network that considers input maps of desired excitation region of interest and outputs a single-channel, multidimensional RF pulse.

The paper '*Joint Design of RF and gradient waveforms via auto-differentiation for 30 tailored excitation in MRI*' by Tianrui Luo, et al. retrieved from ARXIV.org, Cornell University Library, 201, 24 Aug. 2020 discloses a method for joint design of RF and gradient waveforms based on an auto-differentiable Bloch simulator.

SUMMARY OF THE INVENTION

The invention provides for a medical system, a computer program, and a method in the independent claims. Embodiments are given in the dependent claims.

Embodiments may provide for improved selective RF excitation. Embodiments may achieve this by using a convolutional neural network trained to output both the radio frequency waveform used to generate the B1 field and the accompanying spatially selective gradient pulse waveforms. A variety of different types of neural network architectures were investigated and neural networks that multi-task neural networks provided the best results. Multi-task neural networks provide multiple outputs in response to receiving one input. In the examples described herein the convolutional neural network takes a complete complex array, which has been encoded with the desired RF excitation field of view, and outputs the complete radio frequency waveform and the complete spatially selective gradient pulse waveforms. In the case where two-dimensional slices are acquired there are two spatially selective gradient pulse waveforms, and if the acquisition is three-dimensional then there are three spatially selective gradient pulse waveforms that are output.

In one aspect the invention provides for a medical system that comprises a memory storing machine-executable instructions and a convolutional neural network. The convolutional neural network is configured to receive as input a complex array encoding a selection of at least one excitation field of view. The complex array may for example represent a two-dimensional slice to be acquired by magnetic resonance imaging or a three-dimensional volume to be acquired by magnetic resonance imaging.

The convolutional neural network is configured to output a radio frequency waveform and multiple spatially selective gradient pulse waveforms in response to receiving the complex array. The radio frequency waveform may be a waveform used to control a transmitter in a magnetic resonance imaging system to produce a B1 magnetic field. The multiple spatially selective gradient pulse waveforms are each of the gradient pulse waveforms that are matched to the radio frequency waveform to acquire magnetic resonance data for the at least one excitation field of view.

The convolutional neural network is a multi-task convolutional neural network with a first output for the radio frequency waveform and a separate output for each of the multiple spatially selective gradient pulse waveforms. For a two-dimensional magnetic resonance imaging protocol there will be two spatially selective gradient pulse waveforms and for a three-dimensional magnetic resonance imaging protocol there will be three spatially selective gradient pulse waveforms.

The medical system further comprises a computational system. Execution of the machine-executable instructions causes the computational system to receive a selection of the at least one excitation field of view. This for example may be a field of view which the operator or physician is interested in imaging. Execution of the machine-executable instructions further causes the computational system to receive initial pulse sequence commands configured for controlling the magnetic resonance imaging system to acquire k-space data descriptive of a subject. Execution of the machine-executable instructions further causes the computational system to receive the radio frequency waveform and the multiple spatially selective gradient pulse waveforms in response to inputting the complex array into the convolutional neural network.

Execution of the machine-executable instructions further causes the computational system to construct modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view. This embodiment may be beneficial because it may enable the excitation field of view to be specified by the operator of the magnetic resonance imaging system easily. It may also enable the specification of arbitrarily-sized or shaped excitation fields of view. In other cases, it may also enable the specification of multiple excitation fields of view for one acquisition.

The initial pulse sequence commands could for example be preliminary or templated pulse sequence commands that contain a region for which the RF pulse and the gradient pulses for the slice selection need to be specified. Embodiments may therefore provide customization of the pulse sequence commands for a particular acquisition by modifying them with the radio frequency waveform and the multiple spatially selective gradient pulse waveforms.

The present invention concerns automatic generation of the radio frequency (RF) waveform and multiple (two or more) spatially selective gradient waveforms from an input excitation field-of-view and by modifying eth initial pulse sequence commands in as far as the RF waveform and gradient waveforms are concerned. The automatically generated RF wave from and gradient waveforms are return in response to the input excitation field of view by a multi-task convolutional neural network. This multi-task convolutional neural network has several parallel outputs (for the respective waveforms) and is not fully connected. The invention achieves very good accuracy of the resulting waveforms, i.e. having only a small deviation from ground truth information while employing a relatively limited number of nodes and weights as compared to use of a fully connected convolutional network.

In another embodiment the convolutional neural network is trained by the computational system repeatedly performing the following steps: the first repeating step is to generate a training radio frequency waveform and the multiple training spatially selective gradient pulse waveforms using a selective excitation pulse design algorithm Another step that is performed repeatedly is to calculate a model excitation field of view by inputting the training radio frequency waveform entering multiple spatially selective gradient pulse waveforms into a magnetic resonance imaging signal model. Another repeating step is to receive a forward propagated radio frequency waveform and multiple forward propagated spatially selective training gradient pulse waveforms by inputting the model excitation field of view into the convolutional neural network.

Another repeated step is to update parameters in the convolutional neural network by performing back propagation with the training radio frequency waveform and the forward propagated radio frequency waveform and the back propagation is also performed with matching pairs of the multiple training spatially selective gradient pulse waveforms and the multiple forward propagated spatially selective training gradient pulse waveforms. This embodiment may be beneficial because it provides for a convolutional neural network that may be able to specify arbitrary-shaped spaced and sized patient fields of view. It should be noted that these steps may be repeated in a loop but typically they are performed in parallel and the back propagation is to train the convolutional neural network is performed as a vector computing process.

In another embodiment the selected excitation pulse design algorithm is a Shinnar-Le Roux algorithm In another embodiment the selected excitation pulse design algorithm is a small-flip-angle approximation algorithm In another embodiment the selected excitation pulse design algorithm is a numerical optimal control algorithm In another embodiment the magnetic resonance imaging signal model is a numerical solution of the Bloch equations.

In another embodiment the pulse sequence commands are configured for acquiring the k-space data according to a parallel imaging magnetic resonance imaging protocol. This embodiment may be particularly beneficial because when combined with the custom excitation field of view very precise and rapid magnetic resonance images can be acquired.

In another embodiment execution of the machine-executable instructions further causes the computational system to receive a survey magnetic resonance image. Execution of the machine-executable instructions further causes the computational system to render the survey magnetic resonance image on a display. Execution of the machine-executable instructions further causes the computational system to receive a selection of at least one excitation field of view in response to displaying the survey magnetic resonance image. The selection of the at least one excitation field of view is within the survey magnetic resonance image. This embodiment is beneficial because it enables the customization of the excitation field of view for a particular subject and magnetic resonance imaging protocol.

In another embodiment the selection of the at least one field of view is received from an automated image segmentation algorithm. For example, if a radiologist orders a cardiac magnetic resonance imaging protocol the automated segmentation can be used to very precisely limit and specify the imaging of the heart.

In another embodiment the selection of the at least one field of view is received from a user interface. For example, the operator of the system could trace out exactly the field of view that is desired. This may provide for a more flexible means of performing magnetic resonance imaging.

In another embodiment the selection of the at least one field of view is received from an automated segmentation algorithm and from the user interface. For example, portions of the selection of the excitation field of view could be received from an automated imaging segmentation algorithm and other portions could be received from a user interface. The operator could also correct the segmentation from the algorithm using the user interface.

In another embodiment the multiple spatially selective gradient pulse waveforms are two spatially selective gradient pulse waveforms. In each of the at least one excitation field of view is a two-dimensional excitation field of view. For example, the two gradient pulse waveforms are specified and these are used for taking two-dimensional slices. However, it may be configured such that multiple slices are acquired.

In another embodiment the multiple spatially selective gradient pulse waveforms are three spatially selective gradient pulse waveforms. The each of the at least one excitation field of view is a three-dimensional excitation field of view. This may be advantageous because an arbitrary three-dimensional excitation field of view may be specified.

In another embodiment each of the at least one excitation field of view has an arbitrary shape. The excitation field of views are specified by putting complex values into the complex array that is used to encode the selection of the at least one excitation field of view. This enables the specification of an excitation field of view with an arbitrary shape.

In another embodiment each of the at least one excitation field of view is spatially disconnected. For example, since the excitation field of view can be specified arbitrarily for a three-dimensional acquisition, multiple excitation fields of view may be specified. One example would be a magnetic resonance imaging scan where magnetic resonance images of breast tissue for two different breasts are acquired simultaneously but for different radio frequency excitation fields of view.

In another embodiment the neural network is a multi-scale convolutional neural network.

In another embodiment the convolutional neural network is a U-Net convolutional neural network.

In another embodiment the medical system comprises the magnetic resonance imaging system. Execution of the machine-executable instructions further causes the computational system to acquire the k-space data by controlling the magnetic resonance imaging system with the modified pulse sequence commands. Execution of the machine-executable instructions further causes the computational system to reconstruct magnetic resonance imaging data from the k-space data. This embodiment may be beneficial because the excitation field of view has been customized for the particular magnetic resonance imaging acquisition. This may for example provide superior imaging quality in comparison to a situation where a pre-calculated excitation field of view has been used.

In another aspect the invention provides for a computer program comprising machine-executable instructions for execution by a computational system controlling a medical system. The computer program further comprises a convolutional neural network that is configured to receive as input a complex array encoding selection of at least one excitation field of view. The convolutional neural network is configured to output a radio frequency waveform and multiple spatially selective gradient pulse waveforms in response to receiving the complex array. The convolutional neural network is a multi-task convolutional neural network with a first output for the radio frequency waveform and a separate output for each of the multiple spatially selective gradient pulse waveforms.

Execution of the machine-executable instructions causes the computational system to receive a selection of the at least one excitation field of view. Execution of the machine-executable instructions further causes the computational system to receive initial pulse sequence commands configured for controlling the magnetic resonance imaging system to acquire k-space data descriptive of the subject. Execution of the machine-executable instructions further causes the computational system to encode the complex array using the at least one excitation field of view.

Execution of the machine-executable instructions further causes the computational system to receive the radio frequency waveform and the multiple spatially selective gradient pulse waveforms in response to receiving the complex array into the convolutional neural network. Execution of the machine-executable instructions further causes the computational system to construct modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view.

In another aspect the invention provides for a method of medical imaging using the convolutional neural network. The convolutional neural network is configured to receive as input a complex array encoding a selection of the at least one excitation field of view. The convolutional neural network is configured to output a radio frequency waveform and multiple spatially selective gradient pulse waveforms in response to receiving the complex array as input. The convolutional neural network is a multi-task convolutional neural network with a first output for the radio frequency waveform and a separate output for each of the multiple spatially selective gradient pulse waveforms.

The method comprises receiving a selection of the at least one excitation field of view. The method further comprises receiving the initial pulse sequence commands configured for controlling the magnetic resonance imaging system to acquire k-space data descriptive of a subject. The method further comprises encoding the complex array using the at least one excitation field of view. The method further comprises receiving the radio frequency waveform and the multiple spatially selective gradient pulse waveforms in response to inputting the complex array into the convolutional neural network. Finally, the method further comprises constructing modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view.

In another aspect the invention provides for a method of training a convolutional neural network. The method comprises repeatedly performing the following steps. It should be known that these steps may be repeated in sequence multiple times or they may be performed multiple times in parallel. The method performs generating a training radio frequency waveform and multiple training spatially selective gradient pulse waveforms using a selected excitation pulse design algorithm. The method further comprises calculating a model excitation field of view by inputting the training radio frequency waveform and the training multiple spatially selective gradient pulse waveforms into a magnetic resonance imaging signal model.

The method further comprises receiving a forward propagated radio frequency waveform and multiple forward propagated spatially selective training gradient pulse waveforms by inputting the model excitation field of view into the convolutional neural network. The method further comprises updating parameters of the convolutional neural network by performing back propagation with the training radio frequency waveform and the forward propagated radio frequency waveform. Then, with matching pairs of the multiple training spatially selective gradient pulse waveforms and the multiple forward propagated spatially selective training gradient pulse waveforms back propagation is performed also.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) imaging data or a magnetic resonance (MR) image is defined herein as being the reconstructed two- or three-dimensional visualization of anatomic data contained within the k-space data. This visualization can be performed using a computer.

BRIEF DESCRIPTION OF THE DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
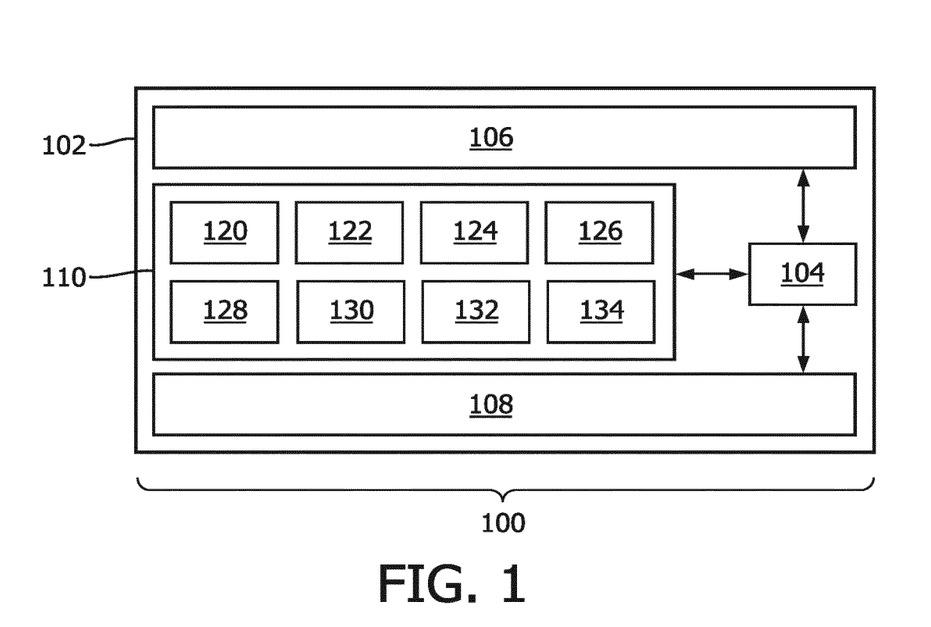
FIG. 1 illustrates an example of a medical system.

FIG. 1 shows a figure which illustrates an example of a medical system 100. The medical system 100 in FIG. 1 is depicted as comprising a computer 102 that comprises a computational system 104. The computational system 104 is intended to represent one or more processing cores or computational systems that may be in the same location or may be distributed. The computer 102 is shown as comprising an optional hardware interface 106 and optional user interface that are connected to the computational system 104. The hardware interface 106 for example may enable the computational system 104 to exchange data with other components of the medical system 100 as well as control those other components. The user interface 108 may enable the operator of the medical system 100 to control it and to interact with it. The user interface 108 could for example comprise a graphical user interface or other graphical control device.

The medical system 100 is further shown as comprising a memory 110 that is in communication with the computational system 104. The memory 110 is intended to represent any combination of memory that may be accessible by the computational system 104.

The memory 110 is shown as containing machine-executable instructions 120. The machine-executable instructions 120 are instructions which enable the computational system to perform such tasks such as controlling other components as well as performing various numerical and image processing tasks. The memory 110 is further shown as comprising a convolutional neural network 122. This convolutional neural network is a multi-task convolutional neural network that has a first output for outputting a radio frequency waveform and a separate output for each of multiple spatially selective gradient pulse waveforms. The convolutional neural network outputs these in response to receiving a complex array that encodes a selection of at least one excitation field of view for magnetic resonance imaging acquisition.

The memory 110 is further shown as containing a selection of at least one excitation field of view 124. The memory is further shown as containing initial pulse sequence commands 126. These for example may be a set of pulse sequence commands that are retrieved from a database or selected when a particular protocol is desired to be executed.

The memory 110 is further shown as containing a complex array that is used to encode the selection of the at least one excitation field of view 124. The memory is further shown as containing a radio frequency waveform 130 and multiple spatially selective gradient pulse waveforms 132 that were received from the convolutional neural network 122 in response to inputting the complex array 128. The memory 110 is further shown as containing modified pulse sequence commands 134. The modified pulse sequence commands 134 was constructed from the initial pulse sequence commands 126 and modified to incorporate the radio frequency waveform 130 and the multiple spatially selective gradient pulse waveforms 132.

Figure 2:
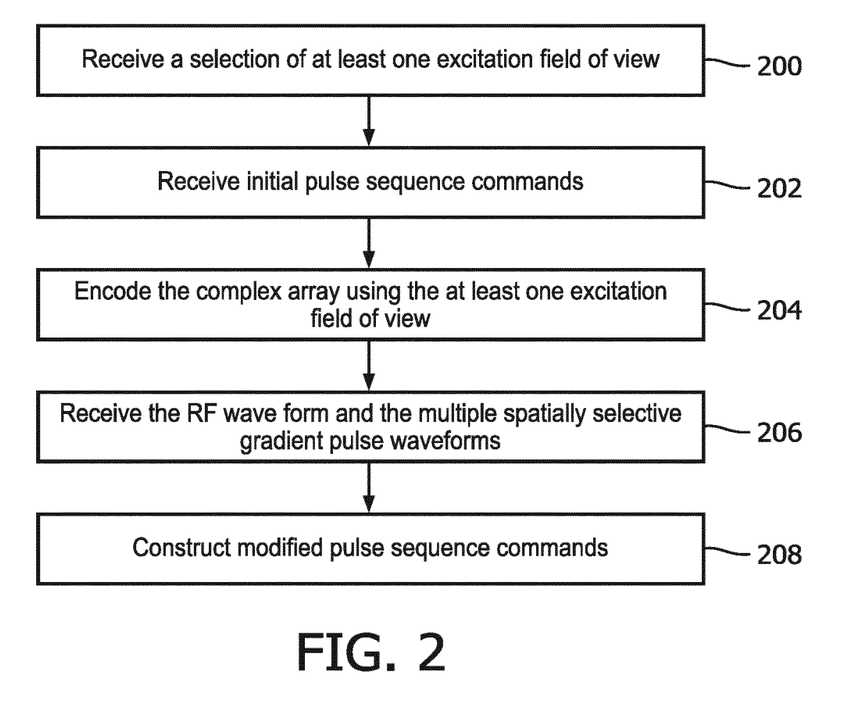
FIG. 2 shows a flow chart which illustrates a method of using the medical system of FIG. 1.

FIG. 2 shows a flowchart which illustrates a method of operating the medical system 100 of FIG. 1. First, in step 200, a selection of at least one excitation field of view 124 is received. Next, in step 202, the initial pulse sequence commands 126 are received. Next, in step 204, the complex array 128 is encoded using the at least one excitation field of view 124. In step 206 the radio frequency waveform 130 and the multiple spatially selective gradient pulse waveforms 132 are received in response to inputting the complex array 128 into the convolutional neural network 122. Finally, in step 208, the modified pulse sequence commands are constructed by integrating the radio frequency waveform 130 and the multiple spatially selective gradient pulse waveforms 132 into the initial pulse sequence commands 126.

Figure 3:
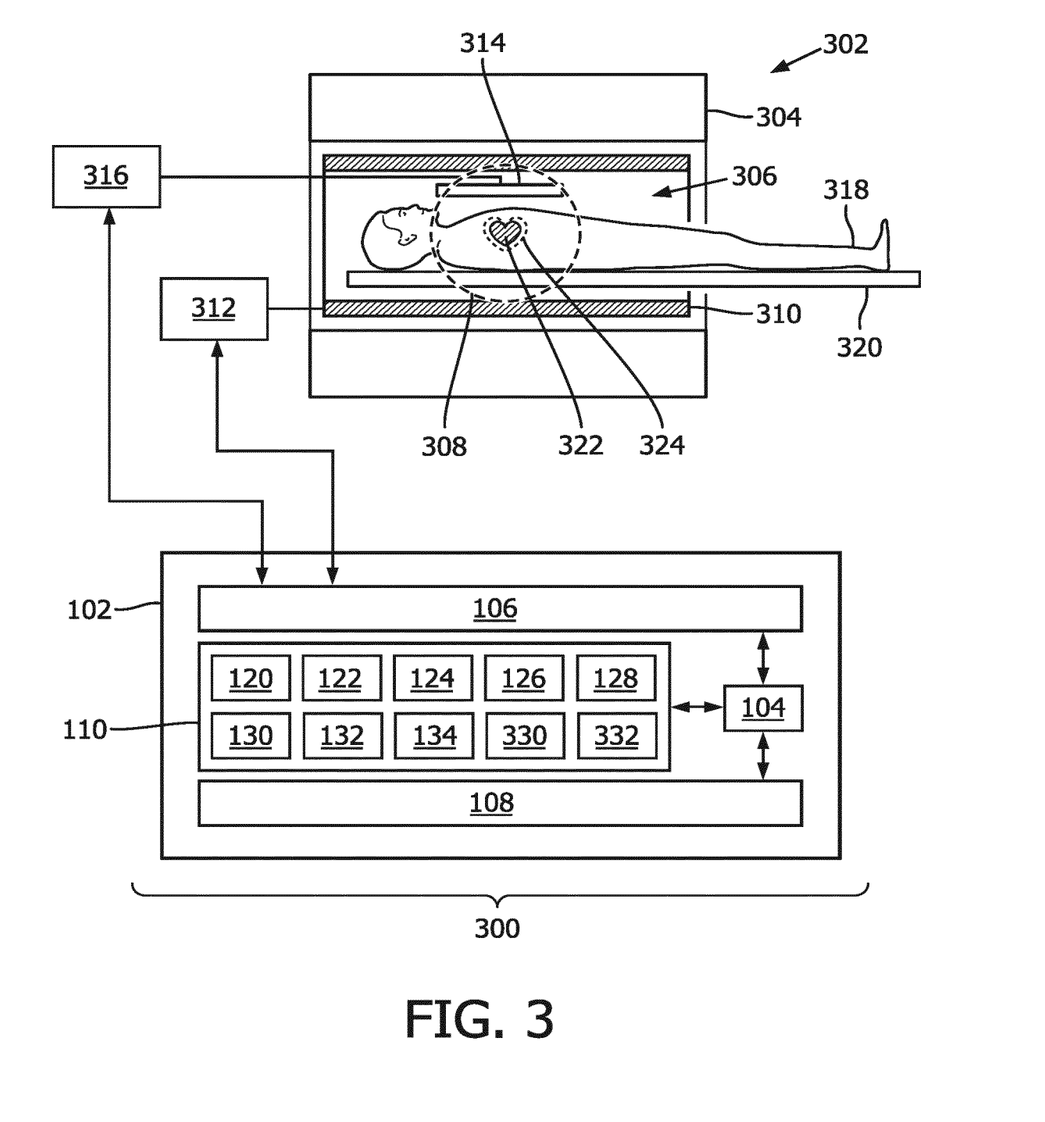
FIG. 3 illustrates a further example of a medical system.

FIG. 3 illustrates a further example of a medical system 300. The medical system 300 is similar to the medical system 100 in FIG. 1 except that it additionally comprises a magnetic resonance imaging system 302 that is controlled by the computational system 104.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. The magnetic resonance data that is acquired typically acquired for the region of interest. A subject 318 is shown as being supported by a subject support 320 such that at least a portion of the subject 318 is within the imaging zone 308.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The transceiver 316 and the gradient controller 312 are shown as being connected to the hardware interface 106 of the computer system 102.

Within the imaging zone 308 there is an anatomical structure 322 of the subject 318. It can be seen that there is an excitation field of view 324 that has been modified to just fit the anatomical structure 322. The excitation field of view 324 is specified by the selection of the at least one excitation field of view 124 and has been encoded into the complex array 128.

The memory 110 is further shown as containing k-space data 330 that has been acquired by the magnetic resonance imaging system 302 by controlling it with the modified pulse sequence commands 134. The k-space data 330 is descriptive of the anatomical structure 322. The memory 110 is shown as further containing magnetic resonance imaging data 332 that has been reconstructed from the k-space data 330.

Figure 4:
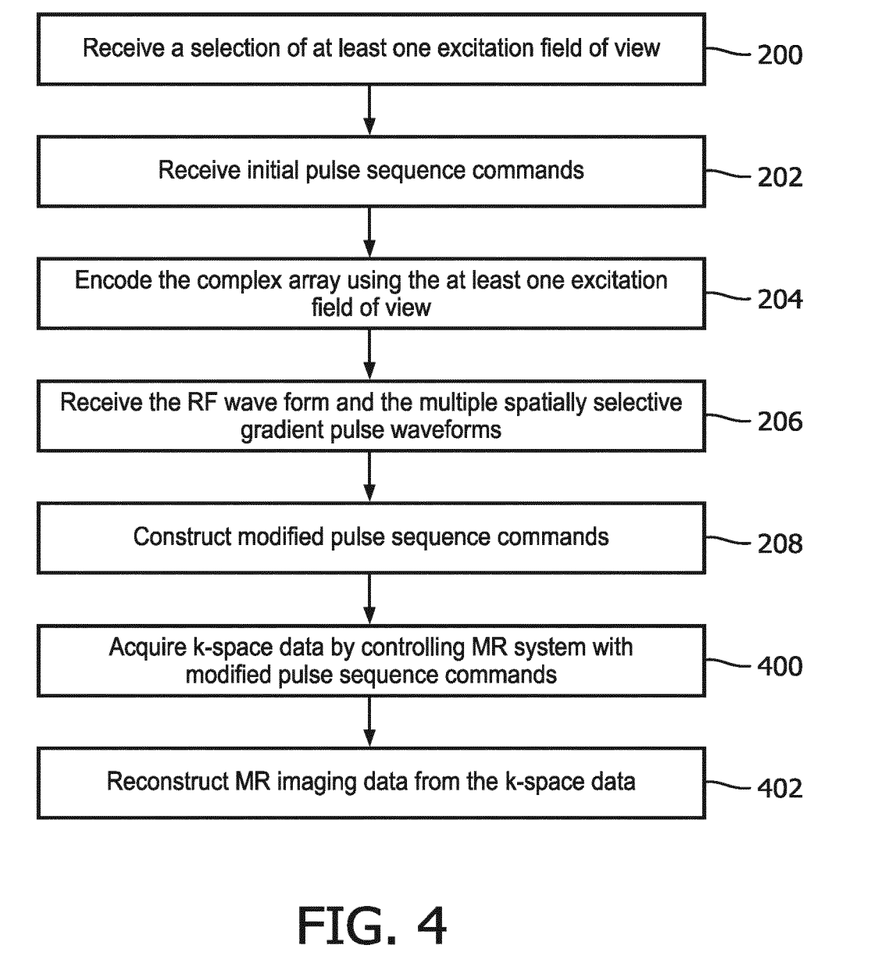
FIG. 4 shows a flow chart which illustrates a method of using the medical system of FIG. 3.

FIG. 4 shows a flowchart which illustrates a method of operating the medical system 300 of FIG. 3. The method starts with the steps 200-208 as are illustrated in FIG. 2. After step 208 has been performed step 400 and then step 402 is performed. In step 400 the k-space data 330 is acquired by controlling the magnetic resonance imaging system 302 with the modified pulse sequence commands 134. Finally, in step 402, the magnetic resonance imaging data 332 is reconstructed from the k-space data 330.

Figure 5:
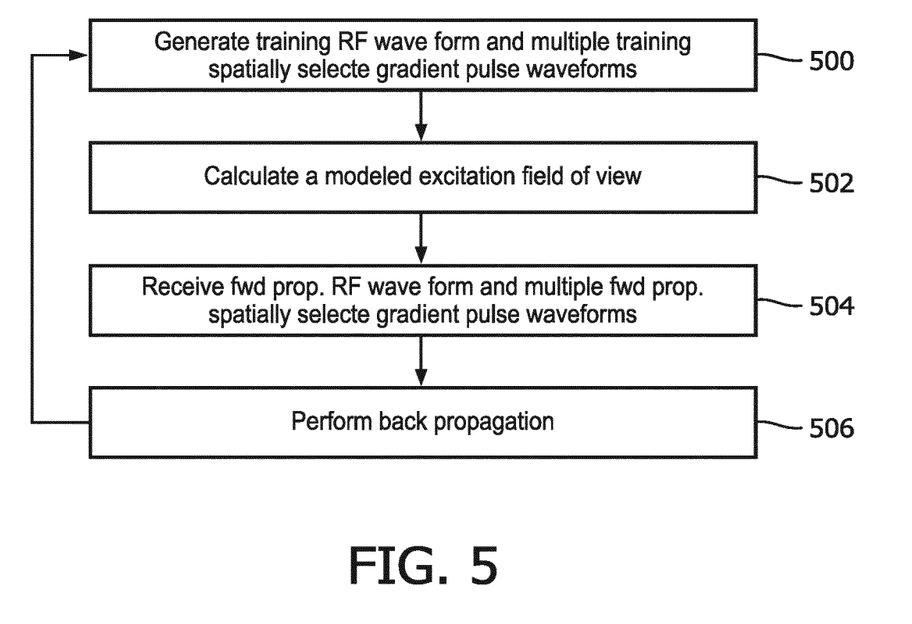
FIG. 5 shows a flow chart which illustrates a method of training a convolutional neural network.

FIG. 5 shows a flowchart which illustrates a method of training the convolutional neural network 122. The steps 500, 502, 504, and 506 are shown as being performed in a loop or being repeated over and over again. However, these steps may be performed in parallel. That is to say all of the training data may be performed by performing steps 500 multiple times then performing steps 502 multiple times, after performing steps 504 and then 506 multiple times. First, in step 500, the training radio frequency waveform and multiple training spatially selective gradient pulse waveforms are generated using a selected excitation pulse design algorithm Next, in step 502, a model excitation field of view is calculated by inputting the training radio frequency waveform and training spatially selective gradient pulses into a magnetic resonance imaging signal model.

After this, in step 504, a forward propagated radio frequency waveform and the multiple forward propagated spatially selective training gradient pulse waveforms are received by inputting the model excitation field of view into the convolutional neural network. Then, in step 506, the convolutional neural network is trained by updating parameters of the convolutional neural network by performing back propagation. The back propagation is performed with the training radio frequency waveform and the forward propagated radio frequency waveform. The back propagation is also performed with matching pairs of the multiple training spatially selective gradient pulse waveforms and the multiple forward propagated spatially selective training gradient pulse waveforms.

Modern MRI systems usually load the pre-set RFs and the accompanying gradients during clinical scans, with minimal adaption to the specific requirements of each scan. Examples may provide for a multi-task multi-scale CNN method for real-time design of excitation RF pulses and the accompanying gradients waveforms that achieve spatially two-dimensional selectivity. The CNN-designed RF and gradients were very close to their SLR-designed counterparts, with NRMSE 0.0075±0.0038 on 400 testing data. The phantom imaging using the predicted RF was also close to the SLR-designed excitation. The algorithm runs on a commercially available workstation within 500 ms Despite the occasional requirements such as self-refocusing or adiabaticity, the most common requirement for a two-dimensional excitation pulse is the excitation profile in both dimensions. The RF pulse design hence poses an inverse problem given the desired spatial and frequency profile, where a small-tip-angle approximation works for small excitation angles and the Shinnar-Le Roux (SLR) algorithm was proven to handle any flip angles from 0° to 180°. For modern MRI instruments, conventional RF pulses and the accompanying gradients are usually designed at the release of the system using either of these two methods, according to the hardware constraints including the maximum allowed B1 field, gradient field strength, and gradient field slew rate, and the resulting waveforms are stored on the system. For each specific scan, some of these waveforms are loaded into spectrometer with scaling in magnitude or stretched in time.

While SLR method is practical and allows for conventional imaging sequences to be acquired, it limits the range of applications preventing any acquisitions where highly specific signal excitations would be beneficial. For instance, spatially two-dimensional excitation has been adopted clinically in diffusion imaging of spinal cord, breast, pancreas, prostate, and cervix to restrict the phase-encode FOV for improved resolution and reduced geometry distortion. Beyond using the SLR algorithm to generate simple two-dimensional excitations, RF and gradient waveforms with completely arbitrary shapes are possible, optimizing the balance between RF performance and duration. The design of these arbitrary RF and gradient waveforms, however, requires iterative algorithms, which are time consuming and prohibit the waveform generation in real-time.

Disclosed in examples is a neural network-based 2-dimensionally selective RF design where both RF and gradient waveforms are generated through a multi-task convolutional neural network in less than a second. This method may perform at each specific scan for optimized RF performance under the given imaging conditions including the hardware restrictions (RF and gradient constraints and number of transmission channels), system imperfections (eddy currents and B0 inhomogeneities), imaging object dependent challenges (local magnetic field inhomogeneities in terms of both B0 and B1), and prescription dependent requirements (FOV of interest). The variable rate selective excitation (VERSE) method has sometimes been applied clinically and its iterative design algorithm has been recently simplified, but it only addresses part of the issues listed above. What we present here is the pilot result of this comprehensive real-time RF design project. This demonstrates the utility of DL as a path to optimized arbitrary excitation pulses in real time.

Figure 6:
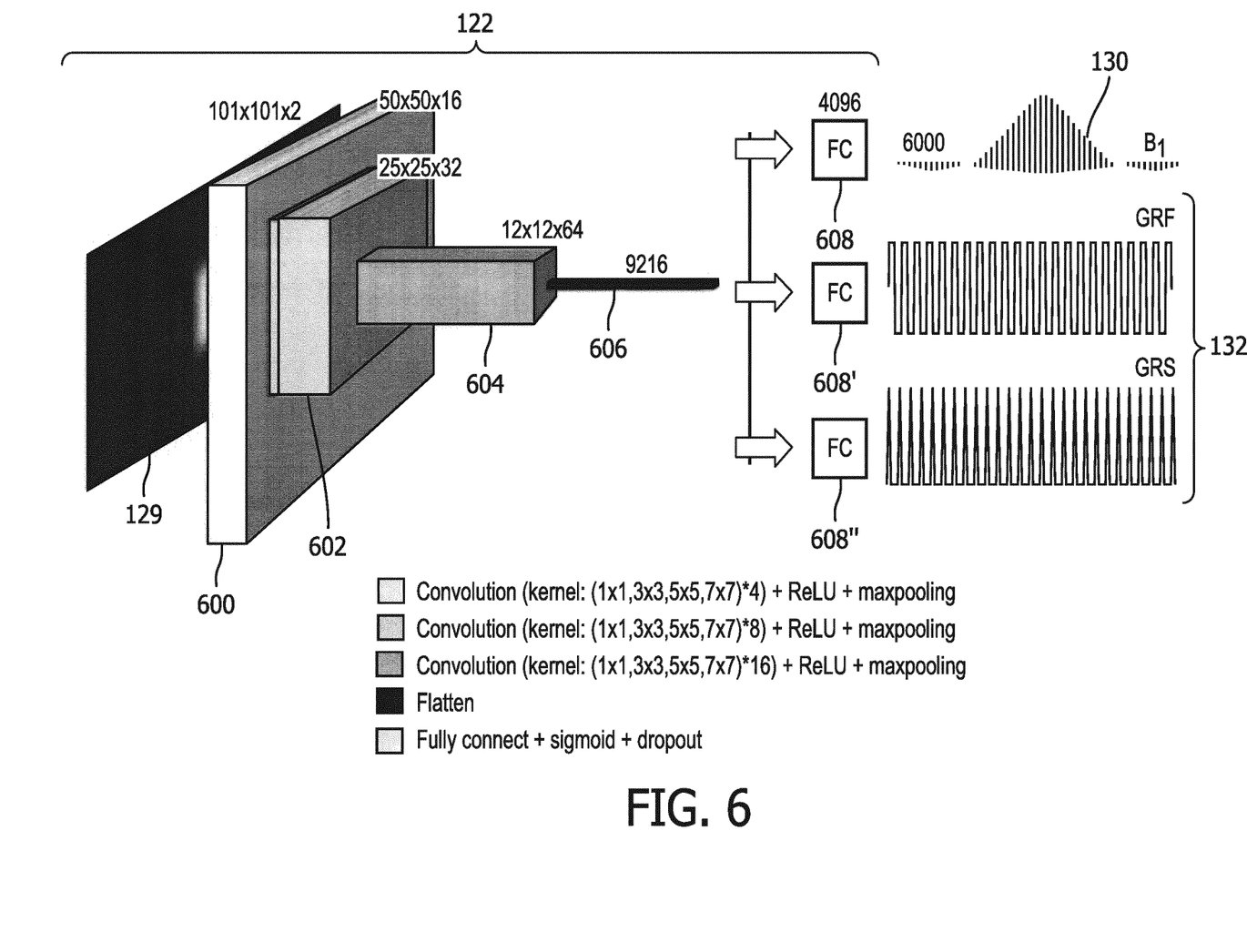
FIG. 6 illustrates an example of a convolutional neural network.

FIG. 6 illustrates one example of a topology or structure for the convolutional neural network 122. This neural network 122 receives an input array 128. There is a first layer 600 comprising a convolutional kernel plus ReLU plus max pooling. This is then fed into a second layer comprising another convolutional kernel ReLU plus max pooling. This then feeds into a third convolutional kernel or layer 604, which also has ReLU and max pooling layers. This then feeds into a flattened layer 606 which is then connected into three separate fully connected layers 608, 608' and 608". Layer 608 outputs the radio frequency waveform 130. Only connected layers 608', 608" output two spatially selective gradient pulse waveforms 132. The neural network 122 illustrated in FIG. 6 may be used for two-dimensional slices. The basic structure could be reused and modified for a three-dimensional excitation field of view. For example, an additional connected layer could be added for the third spatially selective gradient pulse waveform and also the input could be modified to accept a complex three-dimensional array. The exact structure of the various convolutional layers is not essential. The use of the separate connected layers connected to the flattening layer 606 however, showed superior results to other types of neural network topologies.

Example multi-task CNNs may be constructed based on the convolutional framework (hereafter CNN). As shown in FIG. 6 above, it consists of an input layer; three convolutional blocks 600, 602, 604; a flatten layer 606; a fully connected layer 608, 608', 608"; and the output layer. The input layer took the real and imaginary components of the desired excitation profile, hence a three-dimensional matrix (e.g. 101×101×2) with a third dimension-size of 2. The first convolutional block 600 contained 16 convolutional kernels and the rectified linear unit (ReLU), followed by a maximum pooling step. The second 602 and third 604 convolutional blocks contained 32 and 64 convolutional kernels respectively, each followed by the same ReLU activation and maximum pooling. Then a flatten layer 606 was set to transform data to a vector of 9216, which was concatenated by a fully connected layer to yield high-level reasoning with output of matched dimensions. The convergence of the network was evaluated by the minimized loss, which was measured as the root mean square error (RMSE). The parameters of the network were adjusted until the optimal network setting was achieved.

The RF, GRS, and GRF waveforms were considered as three channels of an RF pulse to generate the excitation profile, and a multi-task learning technique was employed, where the flatten layer carrying the shared features was concatenated with three fully-connected layers in parallel. In addition, the convolutional kernels were adjusted to multiple sizes of 1×1, 3×3, 5×5, and 7×7, similar to the strategy in the inception module. The convolution with multiple kernel size captured the feature information in different scales when compared to traditional convolution operations, and this avoided the potential overfitting issue if a deeper network is used.

Examples may contain one or more of the following features:
1) A sufficiently large set of 2D RF pulses were generated using the traditional SLR algorithm for training the CNN.
2) The excitation profile of each pulse was generated through Bloch simulation for training the CNN.
3) A custom convolutional neural network architecture with optimized layers and connections.
4) The network was trained with the generated excitation profiles as inputs and the corresponding RF pulses as outputs.
5) The desired excitation profile was input to the trained network to obtain the CNN-designed RF.

Figure 7:
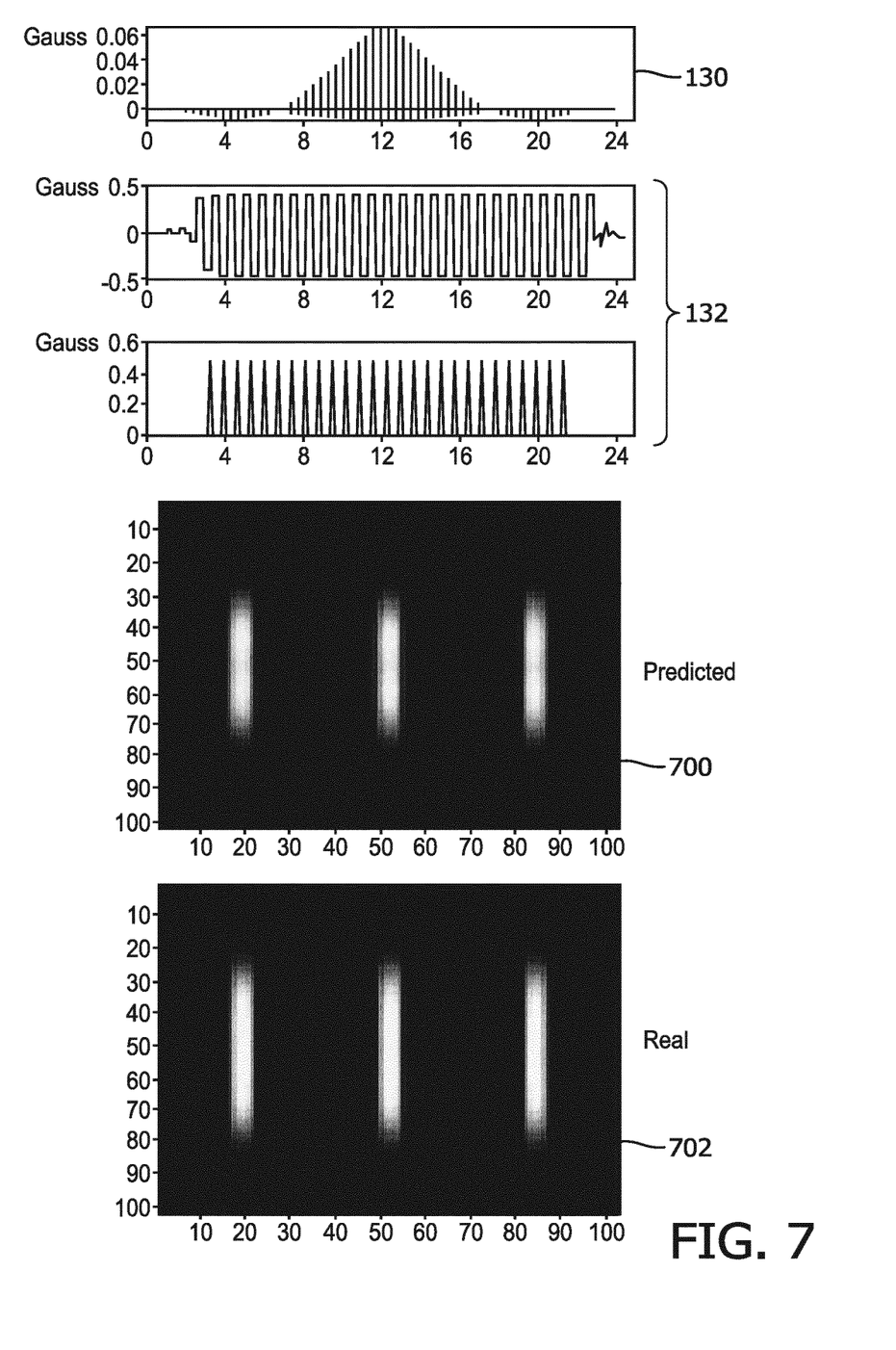
FIG. 7 illustrates the effectiveness of the convolutional neural network in providing a desired excitation field of view.

FIG. 7 illustrates the effectiveness of the radio frequency waveform 130 and multiple spatially selective gradient pulse waveforms 132 provided by the convolutional neural network 122. In this Figure exemplary radio frequency waveform 130 and multiple spatially selective gradient pulse waveforms 132 are illustrated at the top. These waveforms 130, 132 were used to provide the excitation profile 700 in the middle. This is very close to the ground truth excitation field view which is depicted in box 702 below.

Furthermore, the predicted RF can practically provide excitation profile very close to the desired FOV excitation profile. This was tested through phantom imaging on clinical MR 3.0T scanner.

Figure 8:
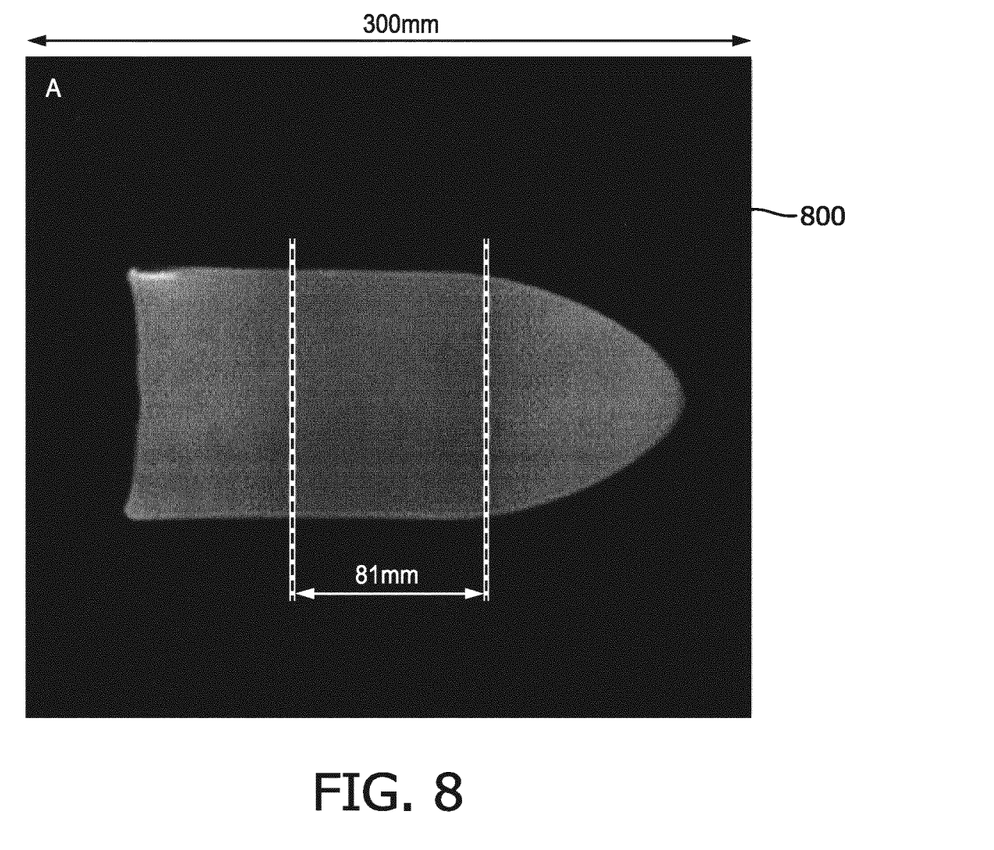
FIG. 8 illustrates a desired field of view.
Figure 9:
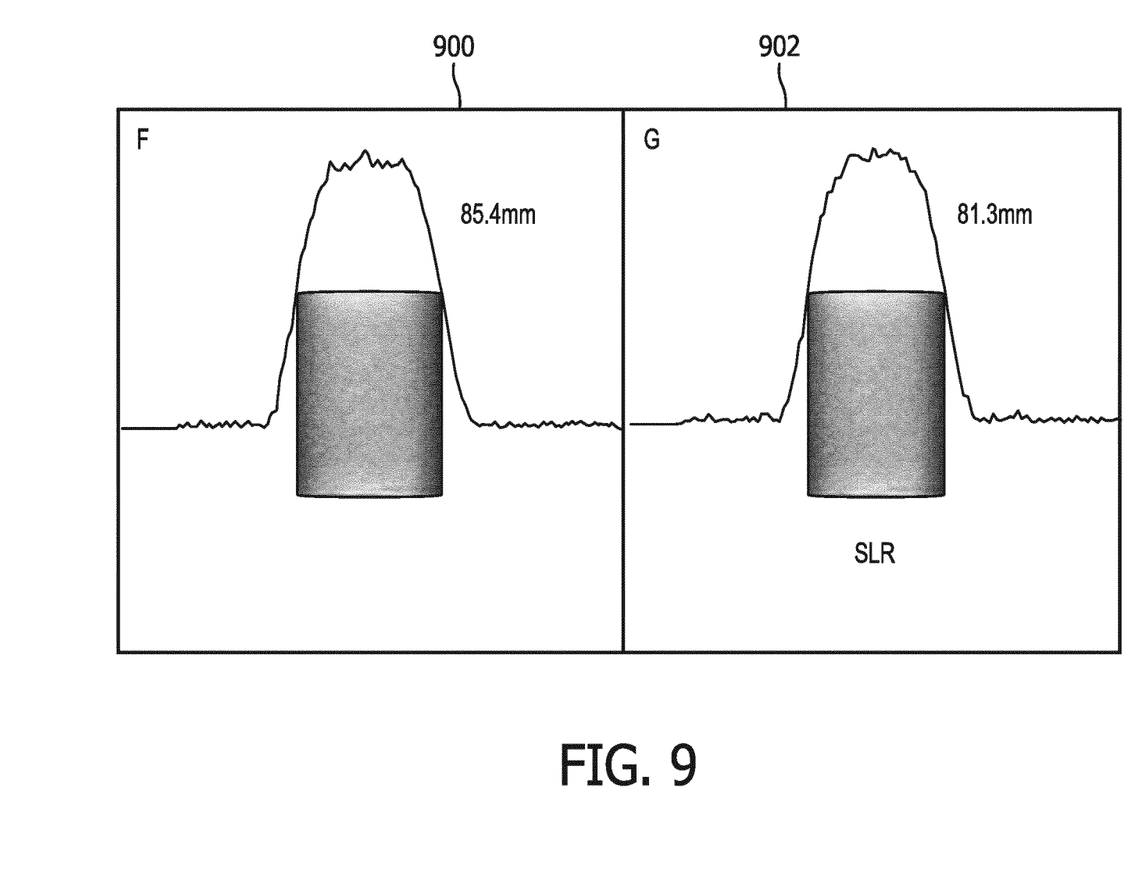
FIG. 9 illustrates a field of view resulting from the use of the convolutional neural network and one from the use of the LSR algorithm

The effectiveness of the convolutional neural network is further illustrated using FIGS. 8 and 9. FIG. 8 shows a desired excitation field of view 800. In FIG. 9, box 900 shows the excitation field of view resulting from the use of the convolutional neural network. On the right side, box 902 shows the excitation field of view resulting from the LSR-design RF pulse. It can be seen that the convolutional neural network matches the LSR-design RF pulse very well.

Examples may contain one or more of the following features:
1) A CNN-based RF design for both RF and gradient waveforms.
2) Multitask technology is used with a shared layer to connect the RF waveform and the two gradients.
3) Multi-scale kernels in the CNN were used to capture the details of different scales in the input FOV image domain.
4) An echo-planar trajectory was selected for the RF generation of the training dataset. This technique may possibly be detected through experiment on scanning and acquiring images.

There may be application for spatially two-dimensional or three-dimensional excitation in the imaging of brain, spinal cord, head-neck tumors, breast, pancreas, and prostate. It allows for improved spatial resolution and reduced geometry distortion for diffusion-weighted imaging.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST 100 medical system
102 computer
104 computational system
106 optional hardware interface
108 optional user interface
110 memory
120 machine executable instructions
122 convolutional neural network
124 selection of at least one excitation field of view
126 initial pulse sequence commands
128 complex array
130 radio frequency wave form
132 multiple spatially selective gradient pulse waveforms
134 modified pulse sequence commands
200 receive a selection of the at least one excitation field of view
202 receive initial pulse sequence commands configured for controlling a magnetic resonance imaging system to acquire k-space data descriptive of a subject
204 encode the complex array using the at least one excitation field of view
206 receive the radio frequency wave form and the multiple spatially selective gradient pulse waveforms in response to inputting the complex array into the convolutional neural network
208 construct modified pulse sequence commands by modifying the initial pulse sequence commands with the radio frequency wave form and the multiple spatially selective gradient pulse waveforms such that the pulse sequence commands are configured to control the magnetic resonance imaging system to acquire the k-space data from the at least one excitation field of view
300 medical system
302 magnetic resonance imaging system
304 magnet
306 bore of magnet
308 imaging zone
310 magnetic field gradient coils
312 magnetic field gradient coil power supply
314 radio-frequency coil
316 transceiver
318 subject
320 subject support
322 anatomical structure
324 excitation field of view
330 k-space data
332 magnetic resonance imaging data
400 acquire the k-space data by controlling the magnetic resonance imaging system with the modified pulse sequence commands
402 reconstruct magnetic resonance imaging data from the k-space data
500 generating a training radio frequency wave form and multiple training spatially selective gradient pulse waveforms using a selective excitation pulse design algorithm
502 calculate a modeled excitation field of view by inputting the training radio frequency wave form and training multiple spatially selective gradient pulse waveforms into a magnetic resonance imaging signal model
504 receive a forward propagated radio frequency wave form and multiple forward propagated spatially selective training gradient pulse waveforms by inputting the modeled excitation field of view into the convolutional neural network
506 update parameters of the convolutional neural network by performing back propagation with the training radio frequency wave form and the forward propagated radio frequency wave form and with matching pairs of the multiple training spatially selective gradient pulse waveforms and the multiple forward propagated spatially selective training gradient pulse waveforms.
600 convolutional kernel with ReLu and Maxpooling layers
602 convolutional kernel with ReLu and Maxpooling layers 604 convolutional kernel with ReLu and Maxpooling layers
606 flatten layer
608 fully connected layer
608' fully connected layer
608" fully connected layer
700 generated excitation field of view
702 ground truth excitation field of view
800 desired excitation field of view
900 exictation field of view resulting from CNN
902 exctiation field of view resulting from use of LSR-designed RF pulse

The invention claimed is:

1. A medical system comprising:
a non-transitory memory configured to store machine executable instructions and a convolutional neural network, wherein the convolutional neural network is configured to receive as input a complex array encoding a selection of at least one excitation field of view, wherein the convolutional neural network is configured to output a radio frequency waveform and multiple spatially selective gradient pulse waveforms, wherein the convolutional neural network is a multi-task convolutional neural network with a first output for the radio frequency waveform and a separate output for each of the multiple spatially selective gradient pulse waveforms; and
a computational system, wherein execution of the machine executable instructions causes the computational system to:
receive the selection of the at least one excitation field of view;
receive initial pulse sequence commands configured for controlling a magnetic resonance imaging system to acquire k-space data descriptive of a subject;
encode the complex array using the at least one excitation field of view;
receive the radio frequency waveform and the multiple spatially selective gradient pulse waveforms in response to inputting the complex array into the convolutional neural network; and
construct modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view.

2. A computer program comprising machine executable instructions stored on a non-transitory computer readable medium for execution by a computational system controlling a medical system, wherein the computer program further comprises: a convolutional neural network configured to receive as input a complex array encoding a selection of at least one excitation field of view, wherein the convolutional neural network is configured to output a radio frequency waveform and multiple spatially selective gradient pulse waveforms, wherein the convolutional neural network is a multi-task convolutional neural network with a first output for the radio frequency waveform and a separate output for each of the multiple spatially selective gradient pulse waveforms, wherein execution of the machine executable instructions causes the computational system to:
receive the selection of the at least one excitation field of view;
receive initial pulse sequence commands configured for controlling a magnetic resonance imaging system to acquire k-space data descriptive of subject;
encode the complex array using the at least one excitation field of view;
receive the radio frequency waveform and the multiple spatially selective gradient pulse waveforms in response to inputting the complex array into the convolutional neural network; and
construct modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view.

3. A method of medical imaging using a convolutional neural network for executution by a computational system, wherein the convolutional neural network is configured to receive as input a complex array encoding a selection of at least one excitation field of view, wherein the convolutional neural network is configured to output a radio frequency waveform and multiple spatially selective gradient pulse waveforms, wherein the convolutional neural network is a multi-task convolutional neural network with a first output for the radio frequency waveform and a separate output for each of the multiple spatially selective gradient pulse waveforms, wherein the method comprises:
receiving, by the computational system, the selection of the at least one excitation field of view;
receiving, by the computational system, initial pulse sequence commands configured for controlling a magnetic resonance imaging (MRI) system to acquire k-space data descriptive of subject-;
encoding, by the computational system, the complex array using the at least one excitation field of view;
receiving, by the computational system, the radio frequency waveform and the multiple spatially selective gradient pulse waveforms in response to inputting the complex array into the convolutional neural network; and
constructing, by the computational system, modified pulse sequence commands by modifying the initial pulse sequence commands with the radio frequency waveform and the multiple spatially selective gradient pulse waveforms such that the pulse sequence commands are configured to control the magnetic resonance imaging system to acquire the k-space data from the at least one excitation field of view.

4. A method of training a convolutional neural network by a computational system, wherein the method comprises repeatedly:
generating a training radio frequency waveform and multiple training spatially selective gradient pulse waveforms using a selective excitation pulse design algorithm, by the computational system;
calculating a modeled excitation field of view, by the computational system, by inputting the training radio frequency waveform and training multiple spatially selective gradient pulse waveforms into a magnetic resonance imaging signal model;
receiving a forward propagated radio frequency waveform and multiple forward propagated spatially selective training gradient pulse waveforms, by the computational system, by inputting the modeled excitation field of view into the convolutional neural network;

updating parameters of the convolutional neural network, by the computational system, by performing back propagation with the training radio frequency waveform and the forward propagated radio frequency waveform and with matching pairs of the multiple training spatially selective gradient pulse waveforms and the multiple forward propagated spatially selective training gradient pulse waveforms.

5. The medical system of claim 1, wherein the convolutional neural network is trained by the computational system repeatedly performing the following steps:
generating a training radio frequency waveform and multiple training spatially selective gradient pulse waveforms using a selective excitation pulse design algorithm;
calculate a modeled excitation field of view by inputting the training radio frequency wave form and training multiple spatially selective gradient pulse waveforms into a magnetic resonance imaging signal model;
receive a forward propagated radio frequency waveform and multiple forward propagated spatially selective training gradient pulse waveforms by inputting the modeled excitation field of view into the convolutional neural network;
update parameters of the convolutional neural network by performing back propagation with the training radio frequency wave form and the forward propagated radio frequency waveform and with matching pairs of the multiple training spatially selective gradient pulse waveforms and the multiple forward propagated spatially selective training gradient pulse waveforms.

6. The medical system of claim 1, wherein the pulse sequence commands are configured for acquiring the k-space data according to a parallel imaging magnetic resonance imaging protocol.

7. The medical system of claim 1, wherein execution of the machine executable instructions further causes the computational system to:
receive a survey magnetic resonance image;
render the survey magnetic resonance image on a display; and
receive the selection of the at least one excitation field of view in response to displaying the survey magnetic resonance image, wherein the selection of the at least one excitation field of view is within the survey magnetic resonance image.

8. The medical system of claim 1, wherein the selection of the at least one field of view is received from any one of the following: an automated image segmentation algorithm, from a user interface, and combinations thereof.

9. The medical system of claim 1, wherein the multiple spatially selective gradient pulse waveforms are two spatially selective gradient pulse waveforms, and wherein the each of at least one excitation field of view is a two-dimensional excitation field of view.

10. The medical system of claim 1, wherein the multiple spatially selective gradient pulse waveforms are three spatially selective gradient pulse waveforms, and wherein the each of at least one excitation field of view is a three-dimensional excitation field of view.

11. The medical system of claim 1, wherein each of the at least one excitation field of view have an arbitrary shape and/or are disconnected spatially.

12. The medical system of claim 1, wherein the convolutional neural network is any one of the following: a multi-scale convolutional neural network or a U-net convolutional neural network.

13. The medical system of claim 1, wherein the medical system comprises the magnetic resonance imaging system, wherein execution of the machine executable instructions further causes the computational system to:
acquire the k-space data by controlling the magnetic resonance imaging system with the modified pulse sequence commands; and
reconstruct magnetic resonance imaging data from the k-space data.

14. The medical system of claim 5, wherein the selective excitation pulse design algorithm is at least one of the following: a Shinnar-Le Roux algorithm, a small-flip-angle approximation algorithm, or a numerical optimal control algorithm.

15. The medical system of claim 5, wherein the magnetic resonance imaging signal model is a numerical solution of the Bloch equations.

* * * * *